(12) United States Patent
Paraschiv et al.

(10) Patent No.: US 7,132,370 B2
(45) Date of Patent: Nov. 7, 2006

(54) METHOD FOR SELECTIVE REMOVAL OF HIGH-K MATERIAL

(75) Inventors: Vasile Paraschiv, Kessel-Lo (BE); Martine Claes, Bertem (BE)

(73) Assignee: Interuniversitair Microelektronica Centrum (IMEC), Leuven (BE)

( * ) Notice: Subject to any disclaimer, the term of this patent is extended or adjusted under 35 U.S.C. 154(b) by 166 days.

(21) Appl. No.: 10/797,888

(22) Filed: Mar. 9, 2004

(65) Prior Publication Data

US 2005/0115925 A1 Jun. 2, 2005

Related U.S. Application Data

(60) Provisional application No. 60/492,020, filed on Aug. 1, 2003.

(51) Int. Cl.
*H01L 21/302* (2006.01)

(52) U.S. Cl. .............. 438/756; 438/745; 438/750; 252/79.1

(58) Field of Classification Search .......... 438/745, 438/750, 752, 754, 756; 252/791, 79.2; 216/103, 216/104

See application file for complete search history.

(56) References Cited

U.S. PATENT DOCUMENTS

| | | | |
|---|---|---|---|
| 4,087,367 A | | 5/1978 | Rioult et al. |
| 5,271,797 A | | 12/1993 | Kamisawa |
| 6,692,976 B1 | * | 2/2004 | Mirkarimi et al. ......... 438/3 |
| 6,835,667 B1 | * | 12/2004 | Christenson et al. ....... 438/745 |
| 2002/0003123 A1 | * | 1/2002 | Lee et al. ................... 216/6 |
| 2003/0104706 A1 | | 6/2003 | Mitsuhashi et al. |
| 2003/0109106 A1 | | 6/2003 | Luis et al. |
| 2004/0067657 A1 | * | 4/2004 | Perng et al. ............... 438/745 |

FOREIGN PATENT DOCUMENTS

EP 0 968 979 A 1/2000

OTHER PUBLICATIONS

Barnett, et al.; Solid State Phenomena, vol. 92, p. 11, 2003; "Wet Etch Enhancement of HfO$_2$ Films by Implant Processing".
Saenger, et al.; MRS Symposium Proceedings, vol. 745 (Novel Materials and Processes for advanced CMOS, Pennsylvania, p. 79-84, 2003; "A Selective Etching Process for Chemically Inert High-k Metal Oxides".
Christenson, et al. Solid State Phenomena, vol. 92, p. 129, 2003; "Selective Wet Etching of High-k Gate Dielectrics".
Watanabe D. et al., *Selective Wet Etching for High-K Material by Organic Solvent Containing Hydrofluoric Acid*Semiconductor Pur Water and Chemicals Conference, Feb. 17, 2003, pp. 117-130, XP008057967.
Christenson, K. *Selective Wet Etching of High-K Materials*, Solid State Technology Online, Jul. 3, 2003 pp. 1-7, XP002361400.
European Search Report for related European Application No. EP 04447059.9, mailed Feb. 8, 2006.

* cited by examiner

*Primary Examiner*—Lan Vinh
(74) *Attorney, Agent, or Firm*—Knobbe Martens Olson & Bear LLP

(57) ABSTRACT

The present invention relates to a method for selectively removing a high-k material comprising providing a high-k material on a semiconductor substrate, and contacting the high-k material with a solution comprising HF, an organic compound, and an inorganic acid.

48 Claims, 1 Drawing Sheet

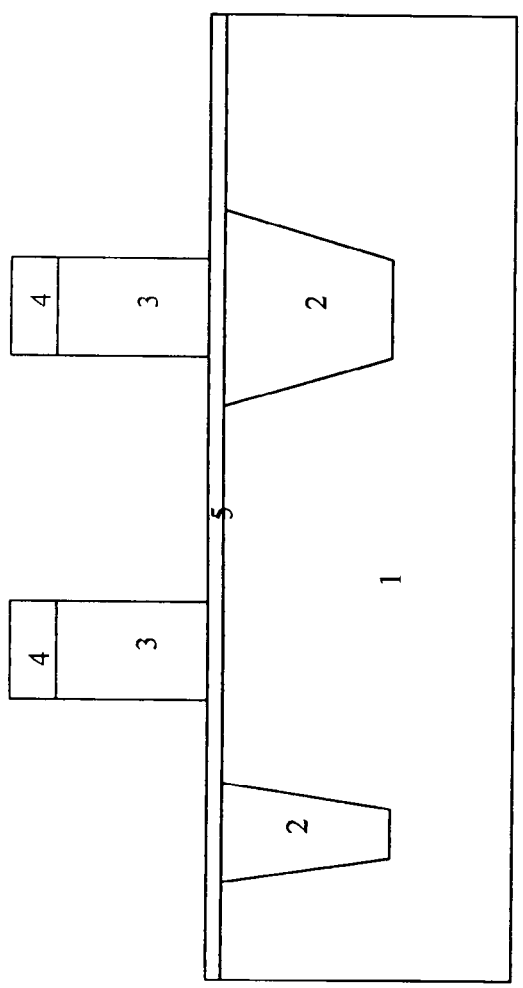
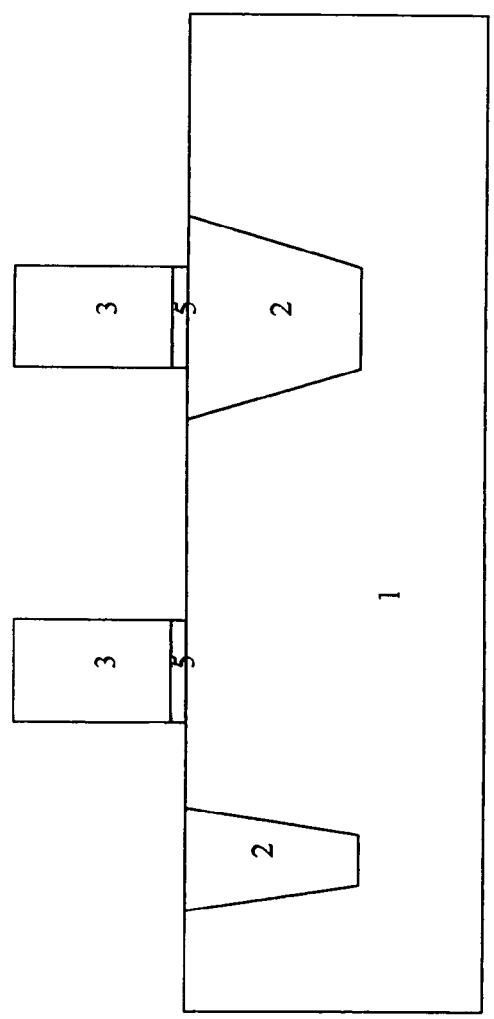

METHOD FOR SELECTIVE REMOVAL OF HIGH-K MATERIAL

RELATED APPLICATION

This application claims the benefit of U.S. Provisional Application No. 60/492,020, filed Aug. 1, 2003.

FIELD OF THE INVENTION

The present invention concerns a new method of etching high-k material in a selective way towards $SiO_2$ and silicon layers.

BACKGROUND OF THE INVENTION

Currently, one of the microelectronics industry's main demands is an increase in circuit density. This means that devices have to be scaled to continuously smaller dimensions. Shrinking transistor feature size necessitates a decrease in the gate dielectric layer thickness, which reaches its practical limit in a conventional gate dielectric material, such as $SiO_2$ or nitrogen-containing $SiO_2$. Because insulation layer thicknesses of less than 2 nm are anticipated in the future, alternatives to conventional gate dielectric materials have to be considered. These materials are characterized by higher dielectric constants when compared to $SiO_2$ (k=4), and have been referred to as high-k dielectric materials. Many dielectrics appear favorable in some property areas, but only few are promising with respect to all property requirements.

Initially, some of the potential gate dielectric candidates, such as $Ta_2O_5$, $SrTiO_3$, and $Al_2O_3$, have been inspired by memory capacitor applications. It was, however, proved that the requirements for transistor applications are much more selective than for memory capacitors. Two key requirements for transistor applications include an extremely high quality of the dielectric-channel interface that can only be approached if the high-k dielectrics are compatible with Si; and that the material is able to withstand Complementary Metal Oxide Semiconductor (CMOS) processing conditions while it is in contact with Si.

Besides of these primary requirements, the integration criteria raise many issues. One of these issues is the selective removability of these almost chemically inert and often relatively hard high-k materials over the source/drain areas. So, both dry and wet removal of high-k materials hold significant challenges with respect to silicon recess. The difficulties in removing possible high-k candidates, as discussed in numerous publications, are enhanced by the fact that the process must be selective to the other layers that are included in the device.

In device applications, the high-k material is mostly thermally treated, making it very resistant to standard wet chemistries, and therefore difficult to remove selectively towards oxide layers. For as-deposited dielectric layers, dilute HF solutions are often used because of their relatively high etch rate. Substantially lower etch rates are observed for thermally treated layers. Nevertheless, the main constraint is not the etch rate but the poor selectivity towards $SiO_2$ and silicon layers.

As presented at the SPWC conference February 2003, California, Daikin reports on selective wet etching of high-k material by using an organic compound/25% HF mixture. The best selectivity reported is 1.7 for heat-treated Metal Organic Chemical Vapor Deposition (MOCVD) $HfO_2$ towards thermal oxide. The highest etch rate for $HfO_2$ is about 1 nm/min, also after annealing. The desired selectivity of 3:1 for thermally treated high-k towards oxide is not reached with their chemistry.

J. Barnett reports in the Proceedings of UCPSS 2002 (Solid State Phenomena, Vol. 92, p. 11, 2003), on the wet etch enhancement of $HfO_2$ films by implant processing. However, the etch rate for a 20 nm $HfO_2$ layer with hot phosphoric acid (155° C.) is only 0.12 nm/min. Other than the low etch rate, no results on selectivity towards other layers are presented. Also, the last monolayer of $HfO_2$ seems not to be removable with hot phosphoric acid.

Mitsuhashi et al. report in U.S. Publication No. 2003-0104706-A1 a method for wet-etching metal oxides. The surface of the metal oxide film is exposed to a plasma, and the exposed metal oxide is then removed by a fluorine-containing solution. However, nothing is mentioned about selectivity towards $SiO_2$, polysilicon, or silicon.

K. Saenger reports in the MRS Symposium Proceedings, Volume 745 (Novel Materials and Processes for advanced CMOS, Pennsylvania, p. 79, 2003) a selective etching process for chemically inert high-k metal oxides. The method used is ion bombardment supplied by an oxygen plasma in a reactive ion etching tool. Avoidance of oxygen treatments is recommended in order not to alter high-k layer characteristics by oxygen diffusion.

K. Christenson reports in Proceedings of UCPSS 2002 (Solid State Phenomena, Vol. 92, p. 129, 2003) the selective wet etching of high-k gate dielectrics. Only selectivity towards $SiO_2$, and not selectivity towards silicon or polysilicon, is reported.

SUMMARY OF THE INVENTION

A reliable method of etching high-k material with sufficient selectivity towards $SiO_2$ and silicon layers is desirable. Such a method is of particular importance for removing a high-k material selectively towards silicon oxide and polysilicon. Moreover, the method can remove the high-k material selective towards $Si_3N_4$. Silicon oxide, polysilicon or silicon nitride can be present on the same substrate as the high-k material. Silicon oxide includes thermal oxide, as known by people skilled in the art.

A high-k material is understood as being a material with a dielectric constant higher than the dielectric constant of silicon oxide. It can be deposited using Atomic Layer Chemical Vapor Deposition (ALCVD) or MOCVD. In a preferred embodiment, the dielectric constant of the high-k material is higher than about 7, higher than about 10, higher than about 15, or higher than about 20. The high-k material can be an oxide of Al, Zr, Hf, or a combination thereof. In a preferred embodiment, the high-k material is selected from the group consisting of $ZrO_2$, $Al_2O_3$, $HfO_2$, $Zr_{1-x}Al_xO_y$, $HfSiO_x$, $HfAlO_x$, and $HfSiO_xN$, wherein x is an integer, and wherein y is an integer. The high-k material can be in the amorphous phase or in the crystalline phase. For either phase, the high-k material can be as-deposited or can be treated at a predetermined temperature.

In a particular embodiment, the ratio of the etch rate of the high-k material towards the etch rate of silicon oxide (also referred to as selectivity towards silicon oxide) is at least about 3:1, higher than about 3:1, or higher than about 5:1. However, in certain embodiments, a lower etch rate can also be acceptable.

In another embodiment, the ratio of the etch rate of the high-k material towards the etch rate of polysilicon (also called the selectivity towards polysilicon) is at least about 3:1, higher than about 10:1, or higher than about 13:1. However, in certain embodiments, a lower etch rate can also be acceptable.

In another embodiment, the ratio of the etch rate of the high-k material towards the etch rate of silicon nitride (also called the selectivity towards silicon nitride) is at least about 3:1, higher than about 10:1, higher than about 15:1 or higher than about 20:1. However, in certain embodiments, a lower etch rate can also be acceptable.

In a preferred embodiment, the concentration of HF is about 0.2 M or less, preferably about 0.1 M or less, preferably from about 0.005 M to about 0.1 M, more preferably from about 0.04 M to about 0.06 M, and most preferably about 0.05 M. However, in certain embodiments, a higher concentration can also be acceptable.

In a preferred embodiment, the inorganic acid can be selected from the group consisting of HCl, $HNO_3$, $H_2SO_4$, $H_3PO_4$, and mixtures thereof. In a preferred embodiment, the inorganic acid is HCl. In certain embodiments, other inorganic acids can be preferred.

In a preferred embodiment, the concentration of the inorganic acid in the solution is typically about 50% or less, preferably about 40% or less, more preferably about 30% or less, still more preferably from about 10% to about 30%, and most preferably about 20%. However, in certain embodiments, a higher concentration can also be acceptable. Variations of HCl concentration resulting in a pH of from about −0.5 or less to about 2 or more are preferred. The inorganic acid is preferably a commercially available diluted solution, including, but not limited to, 37% HCl in water.

In a preferred embodiment, the organic compound is selected such that selectivity is obtained towards other layers present, for example, in transistor applications. Preferably, the organic compound is an organic solvent. In a particularly preferred embodiment, the concentration of the organic solvent is typically at least about 50%, preferably at least about 60%, and more preferably at least about 70%. Preferably, the concentration of the organic solvent is from about 50% to about 100%, more preferably from about 60% to about 90%, and most preferably about 80%. However, in certain embodiments, higher or lower concentrations can also be acceptable.

In another embodiment, an organic compound is selected such that a good wetting of the high-k material is obtained. Preferably, the wettability of the organic compound for the high-k material is higher than the wettability for silicon oxide. Satisfactory wettability is generally understood as having a contact angle towards the high-k material of typically below about 5 degrees, preferably below 4 about degrees, more preferably below about 3 degrees, even more preferably below about 2 degrees, and most preferably below about 1 degree. However, in certain embodiments a wettability above 5 degrees can also be acceptable.

In preferred embodiments, the organic compound can be an alcohol, a ketone such as acetone, or any other polar solvent. A polar solvent is understood to be a solvent that interacts well with polar molecules. A widely used parameter for polarity is the dielectric constant. The dielectric constant of the polar solvent is preferably much lower than the dielectric constant of water. The alcohol is preferably ethanol, isopropylalcohol, ethyleneglycol, or mixtures thereof.

In preferred embodiments, the temperature of the solution is typically about room temperature or higher, preferably about 20° C. or higher, and more preferably about 35° C. or higher. The temperature of the solution is preferably from about 20° C. to about 80° C., more preferably from about 20° C. to about 70° C., more preferably from about 30° C. to about 70° C., more preferably from about 30° C. to about 60° C., and most preferably about 40° C. In certain embodiments, lower temperatures can also be acceptable.

In a particularly preferred embodiment, the solution comprises ethanol, HF, and HCl. The amount of ethanol is preferably about 80%, the concentration of HF is preferably about 0.05 M, and the amount of HCl is preferably about 20%.

In a further embodiment, the solution can be dispersed in the form of a vapor or a mist (such as finely dispersed droplets).

In another embodiment, the solution further comprises a surfactant (as known by a person skilled in the art). The surfactant improves the wettability of the high-k material and further increases the selectivity.

In a further embodiment, the step of subjecting the thermally treated high-k material to a damaging step can comprise a chemical damaging step or a physical damaging step. Chemical damaging includes but is not limited to altering the chemical composition of the high-k material. Physical damaging includes but is not limited to altering the physical properties of the high-k material. The damaging step can comprise a plasma damaging step (preferably with inert species) or a step of damaging by ion implantation (preferably with neutral implants) at low energy.

In preferred embodiments, the highest selectivity for as-deposited and damaged-thermally treated $HfO_2$-based layers is obtained towards thermal oxide, for example, infinite selectivity.

Preferably, a selectivity for as-deposited $HfO_2$-based layers of about 14:1 or more towards polysilicon is obtained.

Preferably, a selectivity for damaged, thermally treated $HfO_2$-based layers of about 250:1 or more towards polysilicon is obtained.

Preferably, a selectivity for damaged, thermally treated $HfO_2$-based layers of about 20:1 or more is obtained towards Low Pressure Chemical Vapor Deposition (LPCVD) $Si_3N_4$.

Preferably, a selectivity of about 9:1 or more is obtained in the case of High Density Plasma (HDP) oxide.

Preferably, a selectivity of about 5:1 or more is obtained in the case of DXZ oxide.

Preferably, a selectivity of about 6:1 or more is obtained in the case of TEOS.

Preferably, a selectivity of about 100:1 or more is obtained in the case of TaN and TiN.

Preferably, an etch rate of about 5 nm/min, in the case of damaged, thermally treated $HfO_2$-based layers, can be obtained at room temperature.

BRIEF DESCRIPTION OF THE DRAWINGS

FIGS. 1a and 1b illustrate, respectively, a device before and after a treatment according to a preferred embodiment.

DETAILED DESCRIPTION OF THE PREFERRED EMBODIMENT

The following description and examples illustrate a preferred embodiment of the present invention in detail. Those of skill in the art will recognize that there are numerous variations and modifications of this invention that are encompassed by its scope. Accordingly, the description of a preferred embodiment should not be deemed to limit the scope of the present invention.

Successful integration of high-k gate stacks requires attention to optimization of the gate patterning. More specifically, a selective removal of high-k films over the source/drain areas is desired. Both dry and wet removal present challenges with respect to silicon recess. The preferred embodiments are particularly well suited for such kinds of applications, as depicted in FIGS. 1a and 1b. FIG. 1a shows a device consisting of a silicon substrate (1), an insulation structure (2), a gate polysilicon (3), a masking material (4), and a layer of high-k material (5). FIG. 1b depicts the resulting device after treatment according to a preferred embodiment. The high-k material is selectively removed, resulting in a remaining layer of high-k material (5) only underneath the polysilicon (3).

The optimized etch chemistry (also referred to as the etch chemical or the etchant) according to the preferred embodiments contains ethanol (or ethyleneglycol), HF, and HCl. The etchant is optimized to yield the highest selectivity towards thermal oxide and polysilicon (and minimal etching). The chemical ratio and temperature are selected to optimize selectivity. The highest selectivity is achieved with a mixture of 80% ethanol, 0.05 M HF (49%) and 20% HCl at a mixing temperature of about 40° C. The active species of the etchant are fluorine based to accomplish etching, but an alcohol is added to achieve selectivity towards other exposed layers in transistor devices.

Improved selectivity for thermally treated (or crystalline material) $HfO_2$ is achieved by damaging the high-k layer by means of a plasma (inert gas) or ion implantation (low energies) prior to wet removal. Other damaging methods may also be employed, as are known in the art.

The etch rates are determined by measuring layer thickness before and after etching on a Plasmos SD2000 ellipsometer. Transmission Electron Microscopy analysis (Philips CM30, 300 KV) is executed to verify Si recess and complete high-k removal on patterned polysilicon/$HfO_2$ gate electrodes. Rutherford Backscattering (RBS) is used to determine complete high-k removal after the damaged etch procedure.

The method according to the preferred embodiments achieves higher selectivity towards $SiO_2$, providing at the same time a reasonable $HfO_2$ etch rate. The selective etch mixture consists of three components, for example, an alcohol, HF, and an inorganic acid, each of them playing a specific role in the etching mechanism. The HF component in the etchant mixture provides the active species for $HfO_2$ removal. In dilute HF (<1M), the following equilibriums are established:

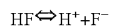

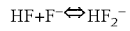

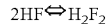

By varying the solution composition, one can select an etching mechanism by $HF_2^-$, $H_2F_2$, or a combination of both. $SiO_2$ is mainly etched by $HF_2^-$ species. In order to get high selectivity towards $SiO_2$ with HF, the etchant restrains $HF_2^-$ species from being generated. One way to accomplish this is by adding an alcohol to the HF solution. An increase of the relative concentration of HF and $H_2F_2$ species is observed with an increase in the percentage of alcohol as a consequence of the lesser dissociation of the molecule. So, the concentration of $F^-$ and $HF_2^-$ species falls to low values for high alcohol concentrations and constant fluoride concentration. An important parameter is the dielectric constant of the alcohol or other polar solvents. It reflects the strength of electrostatic interactions of ions in the solvent. The lower the dielectric constant, the lower the resulting oxide etch rate because of a lesser dissociation of HF. The superior behavior of solutions comprising alcohol can also be related to the surfactant properties of alcohols. While alcohols are generally preferred for use as the organic compound, other organic compounds, or organic solvents, can also be employed.

It is also possible to avoid $HF_2^-$ formation by adding an acid to an aqueous HF solution. This approach permits calculation of the active species as a function of the pH. At low pH (<2), HF is not dissociated. At intermediate pH, the HF is mainly transformed into $HF_2^-$ and at high pH (>8), the mixture contains predominantly $F^-$ ion. When adding HCl (pH<1) to the etch solution, the equilibrium is shifted completely to the left, leaving only HF molecules in solution. When etching a high-k material and thermal oxide at varying pH, it is observed that the etch rate of high-k material decreases significantly at pH 2.5 and higher, while the etch rate of thermal oxide is the highest from about pH 2 to about pH 3. This indicates that the high-k material is mainly etched by HF species, while the thermal oxide is mainly etched by $HF_2^-$ species.

With either a solution containing only HF/alcohol or only an HF/HCl mixture, a good selectivity towards thermal oxide and polysilicon is reached. However to obtain the highest selectivity, a solution comprising each of the above-described components, for example, HF, alcohol, and acid is preferably employed.

Different etch rates for different alcohols in combination with HF/HCl can be due to differences in their wettability on each of the surfaces or by their dielectric constant. Preferably, the wettability for a high-k material is higher than for the thermal oxide. This means that the contact time of the solution on the high-k is higher than on the oxide. In this way, more high-k material is etched when compared to the oxide. The dielectric constant of the alcohol is preferably much lower than the dielectric constant of water.

With an HF concentration in of from about 0.04 M to about 0.06 M, preferably about 0.05 M, the highest selectivity for high-k towards both thermal oxide and polysilicon is obtained. With this concentration, an acceptable amount of high-k material is etched.

Increasing the alcohol concentration increases the selectivity towards thermal oxide and polysilicon. A selectivity of 14:1 towards polysilicon for as-deposited Atomic Layer Deposition (ALD) $HfO_2$ and 250:1 for damaged, thermally treated $HfO_2$ is reached with an 80% ethanol/0.05 M HF/20% HCl mixture. When mixing the components, the temperature is preferably about 40° C. due to the exothermic reaction. Heating the mixture to 80° C. increases the high-k etch rate and results in higher selectivity towards oxide layers.

Employing ethanol in a processing tool can lead to safety issues because of its relatively low flash point (13° C.), and boiling point (78° C.). Therefore, in certain embodiments it may be preferably to employ ethylene glycol, which has a flash point of 111° C. and a boiling point of 198° C.

In device applications, the high-k material is typically thermally treated, making it very resistant to standard wet chemistries, and therefore difficult to remove selectively towards oxide layers. From an integration point of view, a selectivity of about 3:1 (preferably higher) for thermally treated high-k material towards oxide is desirable. This is achieved with an appropriate pre-treatment of the $HfO_2$ layer after the thermal treatment. The applied pre-treatment is typically a damaging of the high-k material. This can be achieved either by ion implantations at low energies or by ion bombardment supplied by, for example, an Ar plasma (inert gas).

Ion implantation can disrupt the crystalline structure (after thermal treatment of ALD $HfO_2$) to enhance wet chemical etching by either a physical damage or chemical mechanism. After implantation of thermally treated ALD $HfO_2$, the etch rate increases for all implanted ions. The damaging effect is generally a function of implant energy and dose. The etch rate can be influenced by altering the implantation dose and the implant energy. High-k material layers can be implanted with As, Ar, Ge, P, B, $BF_2$, or $GeF_2$ at implant energies of 2, 1, 2, 2, 0.5, 2 and 4 keV respectively. The $BF_2$ implantation dosage can be $1e^{15}$ or $2e^{15}$ at/cm$^2$.

Damaging can also be conducted by exposing the thermally treated $HfO_2$-based layers to an ion bombardment from an Ar plasma. In this step, the high-k layer is treated until about 1 nm of high-k material is left on the substrate. Afterwards, the damaged layer can be etched away with the optimal etch solution. In this way, the substrate is not damaged and Si recess can be avoided.

When high-k material is etched dry (with plasma), some polymers and high-k etch residues can still be present on the structures and substrate. The method according to the preferred embodiments can then be applied to remove selectively these post etch high-k residues/polymers.

The above description discloses several methods and materials of the present invention. This invention is susceptible to modifications in the methods and materials, as well as alterations in the fabrication methods and equipment. Such modifications will become apparent to those skilled in the art from a consideration of this disclosure or practice of the invention disclosed herein. Consequently, it is not intended that this invention be limited to the specific embodiments disclosed herein, but that it cover all modifications and alternatives coming within the true scope and spirit of the invention as embodied in the attached claims. All patents, applications, and other references cited herein are hereby incorporated by reference in their entirety.

What is claimed is:

1. A method for selective removal of a high-k material from a substrate, the method comprising:
   providing a high-k material on a semiconductor substrate; and
   contacting the high-k material with a solution comprising HF at a concentration of from about 0.05 M, ethanol at a concentration of about 80%, and HCl at a concentration of about 20%, whereby the high-k material is selectively removed from the substrate.

2. The method according to claim 1, wherein the high-k material has a dielectric constant of greater than or equal to about 7.

3. The method according to claim 1, wherein the high-k material is selected from the group consisting of $ZrO_2$, $Al_2O_3$, $HfO_2$, $Zr_{1-x}Al_xO_y$, $HfSiO_x$, $HfAlO_x$, $HfSiO_xN$, and combinations thereof, wherein x is an integer, and wherein y is an integer.

4. The method according to claim 1, wherein a wettability of the ethanol for the high-k material is higher than a wettability of the ethanol for silicon oxide.

5. The method according to claim 1, wherein a temperature of the solution is from about 20° C. to about 80° C.

6. The method according to claim 1, wherein a temperature of the solution is about 40° C.

7. The method according to claim 1, wherein the solution further comprises a surfactant.

8. The method according to claim 1, wherein the solution has a pH of from about −0.5 to about 2.

9. A method for selective removal of a high-k material from a semiconductor substrate comprising:
   providing a high-k material on a semiconductor substrate;
   subjecting the high-k material to damaging, whereby a damaged high-k material is obtained; and thereafter
   contacting the damaged high-k material with a solution comprising HF at a concentration of from about 0.05 M, ethanol at a concentration of about 80%, and HCl at a concentration of about 20%, whereby the high-k material is selectively removed from the substrate.

10. The method according to claim 9, wherein the high-k material has a dielectric constant of greater than or equal to about 7.

11. The method according to claim 9, wherein the high-k material is selected from the group consisting of $ZrO_2$, $Al_2O_3$, $HfO_2$, $Zr_{1-x}Al_xO_y$, $HfSiO_x$, $HfAlO_x$, $HfSiO_xN$, and combinations thereof, wherein x is an integer, and wherein y is an integer.

12. The method according to claim 9, wherein a wettability of the ethanol for the high-k material is higher than a wettability of the ethanol for silicon oxide.

13. The method according to claim 9, wherein a temperature of the solution is from about 20° C. to about 80° C.

14. The method according to claim 9, wherein a temperature of the solution is about 40° C.

15. The method according to claim 9, wherein the solution further comprises a surfactant.

16. The method according to claim 9, wherein the solution has a pH of from about −0.5 to about 2.

17. The method according to claim 9, wherein the damaging comprises chemical damaging.

18. The method according to claim 9, wherein the damaging comprises physical damaging.

19. A method for selective removal of a high-k material from a substrate, the method comprising:
   providing a high-k material on a semiconductor substrate; and
   contacting the high-k material with a solution comprising HF at a concentration of from about 0.04 M to about 0.06 M, an alcohol at a concentration greater than or equal to about 50%, and HCl at a concentration of from about 10% to about 30%, whereby the high-k material is selectively removed from the substrate.

20. The method according to claim 19, wherein the high-k material has a dielectric constant of greater than or equal to about 7.

21. The method according to claim 19, wherein the high-k material is selected from the group consisting of $ZrO_2$, $Al_2O_3$, $HfO_2$, $Zr_{1-x}Al_xO_y$, $HfSiO_x$, $HfAlO_x$, $HfSiO_xN$, and combinations thereof, wherein x is an integer, and wherein y is an integer.

22. The method according to claim 19, wherein a concentration of HF in the solution is about 0.05 M.

23. The method according to claim 19, wherein a concentration of the HCl in the solution is about 20%.

24. The method according to claim 19, wherein a wettability of the alcohol for the high-k material is higher than a wettability of the alcohol for silicon oxide.

25. The method according to claim 19, wherein the alcohol is selected from the group consisting of ethanol, isopropylalcohol, ethyleneglycol, and mixtures thereof.

26. The method according to claim 19, wherein a concentration of the alcohol in the solution is from about 60% to about 90%.

27. The method according to claim 19, wherein a concentration of the alcohol in the solution is about 80%.

28. The method according to claim 19, wherein a temperature of the solution is from about 20° C. to about 80° C.

29. The method according to claim 19, wherein a temperature of the solution is about 40° C.

30. The method according to claim 19, wherein the alcohol is ethanol.

31. The method according to claim 19, wherein the solution further comprises a surfactant.

32. The method according to claim 19, wherein the solution has a pH of from about −0.5 to about 2.

33. A method for selective removal of a high-k material from a semiconductor substrate comprising:
providing a high-k material on a semiconductor substrate;
subjecting the high-k material to damaging, whereby a damaged high-k material is obtained; and thereafter
contacting the damaged high-k material with a solution comprising HF at a concentration of from about 0.04 M to about 0.06 M, an alcohol at a concentration greater than or equal to about 50%, and HCl at a concentration of from about 10% to about 30%, whereby the high-k material is selectively removed from the substrate.

34. The method according to claim 33, wherein the high-k material has a dielectric constant of greater than or equal to about 7.

35. The method according to claim 33, wherein the high-k material is selected from the group consisting of $ZrO_2$, $Al_2O_3$, $HfO_2$, $Zr_{1-x}Al_xO_y$, $HfSiO_x$, $HfAlO_x$, $HfSiO_xN$, and combinations thereof, wherein x is an integer, and wherein y is an integer.

36. The method according to claim 33, wherein a concentration of HF in the solution is about 0.05 M.

37. The method according to claim 33, wherein a concentration of the HCl in the solution is about 20%.

38. The method according to claim 33, wherein a wettability of the alcohol for the high-k material is higher than a wettability of the alcohol for silicon oxide.

39. The method according to claim 33, wherein the organic compound is selected from the group consisting of ethanol, isopropylalcohol, ethyleneglycol, and mixtures thereof.

40. The method according to claim 33, wherein a concentration of the alcohol in the solution is from about 60% to about 90%.

41. The method according to claim 33, wherein a concentration of the alcohol in the solution is about 80%.

42. The method according to claim 33, wherein a temperature of the solution is from about 20° C. to about 80° C.

43. The method according to claim 33, wherein a temperature of the solution is about 40° C.

44. The method according to claim 33, wherein the alcohol is ethanol.

45. The method according to claim 33, wherein the solution further comprises a surfactant.

46. The method according to claim 33, wherein the solution has a pH of from about −0.5 to about 2.

47. The method according to claim 33, wherein the damaging comprises chemical damaging.

48. The method according to claim 33, wherein the damaging comprises physical damaging.

* * * * *